US012795860B2

(12) United States Patent
Hegde et al.

(10) Patent No.: US 12,795,860 B2
(45) Date of Patent: Nov. 10, 2026

(54) INTEGRATED HEAT SPREADER

(71) Applicant: Honeywell International Inc., Charlotte, NC (US)

(72) Inventors: Prashant Hegde, Sriracha (TH); Nishanth Selvaraj, Sriracha (TH); Baskaran Selvan, Sriracha (TH)

(73) Assignee: Solstice Advanced Materials US, Inc., Morris Plains, NJ (US)

( * ) Notice: Subject to any disclaimer, the term of this patent is extended or adjusted under 35 U.S.C. 154(b) by 149 days.

(21) Appl. No.: 18/124,982

(22) Filed: Mar. 22, 2023

(65) Prior Publication Data

US 2023/0354558 A1 Nov. 2, 2023

Related U.S. Application Data

(60) Provisional application No. 63/336,199, filed on Apr. 28, 2022.

(51) Int. Cl.
*H05K 7/20* (2006.01)
*B21D 53/04* (2006.01)

(52) U.S. Cl.
CPC ......... *H05K 7/20509* (2013.01); *B21D 53/04* (2013.01)

(58) Field of Classification Search
CPC ............................ H05K 7/20; H05K 7/20509
USPC ........................................................ 165/80.3
See application file for complete search history.

(56) References Cited

U.S. PATENT DOCUMENTS 5,798,566 A * 8/1998 Sato .................... H01L 23/3735 257/E23.102
6,665,187 B1 * 12/2003 Alcoe ................... H10W 40/10 257/E23.101
7,079,393 B2 * 7/2006 Colgan ............... H10W 40/475 174/15.1
7,126,218 B1 * 10/2006 Darveaux ............. H10W 40/22 257/691
7,271,479 B2 9/2007 Zhao et al.
7,968,982 B2 * 6/2011 Wu ..................... H10W 40/778 257/796

(Continued)

FOREIGN PATENT DOCUMENTS

DE 3011491 A1 10/1980
JP 2005-327767 A 11/2005

(Continued)

OTHER PUBLICATIONS

JP2015002302A Machine Translation (Year: 2015).*

(Continued)

*Primary Examiner* — Jenna M Maroney
*Assistant Examiner* — Gustavo A Hincapie Serna
(74) *Attorney, Agent, or Firm* — Faegre Drinker Biddle & Reath LLP

(57) ABSTRACT

A heat spreader includes a top surface opposite a bottom surface, a cavity extending from the bottom surface, the cavity defined by a profile having at least two steps such that the cavity includes a first surface spaced from the bottom surface of the cavity by a first distance, a second surface spaced from the bottom surface of the cavity by a second distance, and the first distance being less than the second distance. The heat spreader further includes a lid defined by a thickness extending between the bottom surface of the cavity and the top surface of the heat spreader.

12 Claims, 11 Drawing Sheets

(56) References Cited

U.S. PATENT DOCUMENTS

| | | | | |
|---|---|---|---|---|
| 8,184,432 | B2* | 5/2012 | Miyashita | G06F 1/20 361/728 |
| 8,415,809 | B2* | 4/2013 | Kang | H10W 40/70 438/126 |
| 9,530,714 | B2* | 12/2016 | Kalchuri | H01L 23/36 |
| 9,570,372 | B1* | 2/2017 | Lin | H01L 23/3675 |
| 10,020,236 | B2* | 7/2018 | Wang | H01L 24/83 |
| 11,915,991 | B2* | 2/2024 | Yeh | H10W 40/037 |
| 2005/0104195 | A1* | 5/2005 | Yang | H01L 23/4334 257/E23.092 |
| 2005/0285258 | A1* | 12/2005 | Chen | H10W 40/778 257/E23.092 |
| 2006/0170094 | A1* | 8/2006 | Subramanian | H10W 40/22 257/E21.503 |
| 2006/0175692 | A1* | 8/2006 | Hsu | H10W 70/614 257/679 |
| 2007/0210438 | A1* | 9/2007 | Briere | H10W 40/22 257/E23.092 |
| 2008/0179618 | A1* | 7/2008 | Cheng | H10H 20/8581 257/E25.02 |
| 2008/0180914 | A1* | 7/2008 | Khanna | H01L 23/473 361/704 |
| 2008/0211079 | A1* | 9/2008 | Onodera | H10H 20/8586 257/E23.101 |
| 2008/0290505 | A1* | 11/2008 | Kolan | H01L 23/24 257/E23.101 |
| 2009/0027857 | A1* | 1/2009 | Dean | H01L 23/04 29/890.032 |
| 2009/0283902 | A1* | 11/2009 | Bezama | H01L 23/3675 257/713 |
| 2010/0148357 | A1* | 6/2010 | Yang | H01L 23/3675 257/713 |
| 2011/0103020 | A1* | 5/2011 | Dangelo | H01L 23/473 361/709 |
| 2014/0061893 | A1* | 3/2014 | Saeidi | H01L 23/562 438/122 |
| 2014/0239482 | A1* | 8/2014 | Kourakata | H10W 40/037 165/185 |
| 2015/0235935 | A1* | 8/2015 | Lin | H01L 21/4871 438/122 |
| 2015/0366047 | A1* | 12/2015 | Okasaka | H05K 1/021 174/254 |
| 2017/0186628 | A1 | 6/2017 | Antoniswamy et al. | |
| 2018/0012820 | A1 | 1/2018 | Antoniswamy et al. | |
| 2018/0255658 | A1* | 9/2018 | Kaneko | B29C 65/70 |
| 2019/0043778 | A1* | 2/2019 | Tang | H01L 21/4882 |
| 2019/0348341 | A1* | 11/2019 | Pax | H01L 23/367 |
| 2020/0008292 | A1* | 1/2020 | Sato | B29C 45/14336 |
| 2021/0066154 | A1* | 3/2021 | Kim | H10W 40/22 |
| 2021/0408976 | A1* | 12/2021 | Lim | H03F 1/0288 |
| 2023/0282541 | A1* | 9/2023 | Nishiyama | H10W 40/22 257/675 |
| 2023/0413481 | A1* | 12/2023 | Wang | H05K 7/2029 |

FOREIGN PATENT DOCUMENTS

| | | | | |
|---|---|---|---|---|
| JP | 2015002302 | A | * | 1/2015 |
| KR | 10-2003-0049493 | A | | 6/2003 |
| KR | 10-0687582 | B1 | | 2/2007 |

OTHER PUBLICATIONS

International Preliminary Report on Patentability received for PCT Patent Application No. PCT/US2023/019409, mailed on Nov. 7, 2024, 7 pages.

International Search Report and Written Opinion received for PCT Patent Application No. PCT/US2023/019409, mailed on Aug. 9, 2023, 10 pages.

European Search Report for EP Patent Application No. 23797065.2, Issued on Mar. 5, 2026, 11 pages.

* cited by examiner

INTEGRATED HEAT SPREADER

CROSS-REFERENCE TO RELATED APPLICATION

This application claims priority to Provisional Application No. 63/336,199, filed Apr. 28, 2022, which is herein incorporated by reference in its entirety.

FIELD OF THE INVENTION

The present disclosure relates generally to an integrated heat spreader and methods of forming an integrated heat spreader.

BACKGROUND

Heat spreaders are often used in computer chip packages to draw heat from a chip, semiconductor die, and/or processor and transfer the heat to a heat sink to be dissipated. FIG. 1 illustrates a system established in the art and incorporates the use of heat spreaders. Specifically, a substrate 10 is shown positioned below a chip 12, also referred to as a die, that may be positioned adjacent and below a thermal interface material sheet 14. In some uses, the thermal interface material sheet 14 is composed of various types of polymers, such as silicone, for example. The chip 12 and thermal interface material sheet 14 may be arranged adjacent, and in some embodiments, within a recessed portion of, a heat spreader 20. The heat spreader 20 is arranged adjacent a second layer of the thermal interface material 14. Adjacent the second layer of the thermal interface material 14, the system may include a heat sink 18.

As a result of the above described configuration, during operation of the chip 12, heat generated by the chip 12 is discharged to the heat sink 18 via the heat spreader 20. The heat spreader 20 is able to disperse and spread the heat across the heat spreader 20, facilitating efficient heat transfer to the heat sink 18. In this way, the heat generated by the chip 12 does not cause localized damage to the components in the system. The heat that is dispersed by the heat spreader 20 may then be transferred to the heat sink 18 to be dissipated.

As previously described, in some instances, the heat spreader 20 may have a recess or cavity configured for receiving the chip 12. FIGS. 2A and 2B illustrate an additional embodiments of the heat spreader 20. As illustrated, the heat spreader 20 includes a top side 22 and a bottom side 24, the bottom side 24 having a cavity 26 extending within the bottom side 24. In operation, the chip 12 (FIG. 1) may be arranged within the cavity 26. In these embodiments, it may be desired to have a recess and/or cavity of a shape and size that is optimized to engage with the chip 12 being incorporated into the system.

In manufacture, the heat spreaders 20 may be formed in large volumes by cutting a blank from the sheet or strip of bulk material and by using a combination of stamping processes to impart the desired shape and features to the blank to ultimately produce the desired heat spreader. When the heat spreader 20 includes the cavity 26, the cavity 26 may be formed from punching the material from the blank into a shape and geometry configured for receiving the processor or die in operation. During this process of punching the heat spreader 20 to form the desired shape, the punching force causes cold flow of the material from areas of high pressure into areas of lower pressure. As such, a stamping system can be designed with desired sizes and/or shapes to create the target shape of the cavity 26.

SUMMARY

The present disclosure provides a heat spreader including a top surface opposite a bottom surface, a cavity extending from the bottom surface, the cavity defined by a profile having at least two steps such that the cavity includes a first surface spaced from the bottom surface of the cavity by a first distance, a second surface spaced from the bottom surface of the cavity by a second distance, and the first distance being less than the second distance. The heat spreader further includes a lid defined by a thickness extending between the bottom surface of the cavity and the top surface of the heat spreader.

In one form thereof, the present disclosure provides a heat spreader including a top surface opposite a bottom surface and a plurality of sides defining a generally rectangular shape of the heat spreader, a cavity extending from the bottom surface, the cavity defined by a profile having at least two steps such that the cavity includes a first surface spaced from the bottom surface of the cavity by a first distance, a second surface spaced from the bottom surface of the cavity by a second distance, the first distance being less than the second distance and an outer periphery extending along the plurality of sides of the heat spreader. The heat spreader further includes wherein the three steps of the cavity includes a first step extending downwardly from a bottom surface of the cavity, a second step extending downward from and laterally outward from the first step, and a third step extending downward from and laterally outward from the second step and vertically above the outer periphery.

In another form thereof, the present disclosure provides a method of forming a heat spreader including stamping a bottom surface of a sheet of the material with a die and a press of a stamping system to half shear the material forming a cavity, such that the cavity has a bottom surface and a top surface, holding the material of the bottom surface and the top surface of the cavity, during the step of holding the material of the bottom surface and the top surface of the cavity, stamping at least a portion of the sheet of material to form a first step extending around the cavity, and holding the material of the cavity and of the first step constant. The method further includes during the step of holding the material of the cavity and of the first step constant, stamping the at least a portion of the sheet of material to form a second step extending around the cavity and the first step.

BRIEF DESCRIPTION OF FIGURES

The above mentioned and other features of this invention, and the manner of attaining them, will become more apparent and the invention itself will be better understood by reference to the following description of embodiments of the invention taken in conjunction with the accompanying drawings, where.

Corresponding reference characters indicate corresponding parts throughout the several views. Unless stated otherwise the drawings are drawn to scale and proportional.

DETAILED DESCRIPTION

Figure 3:
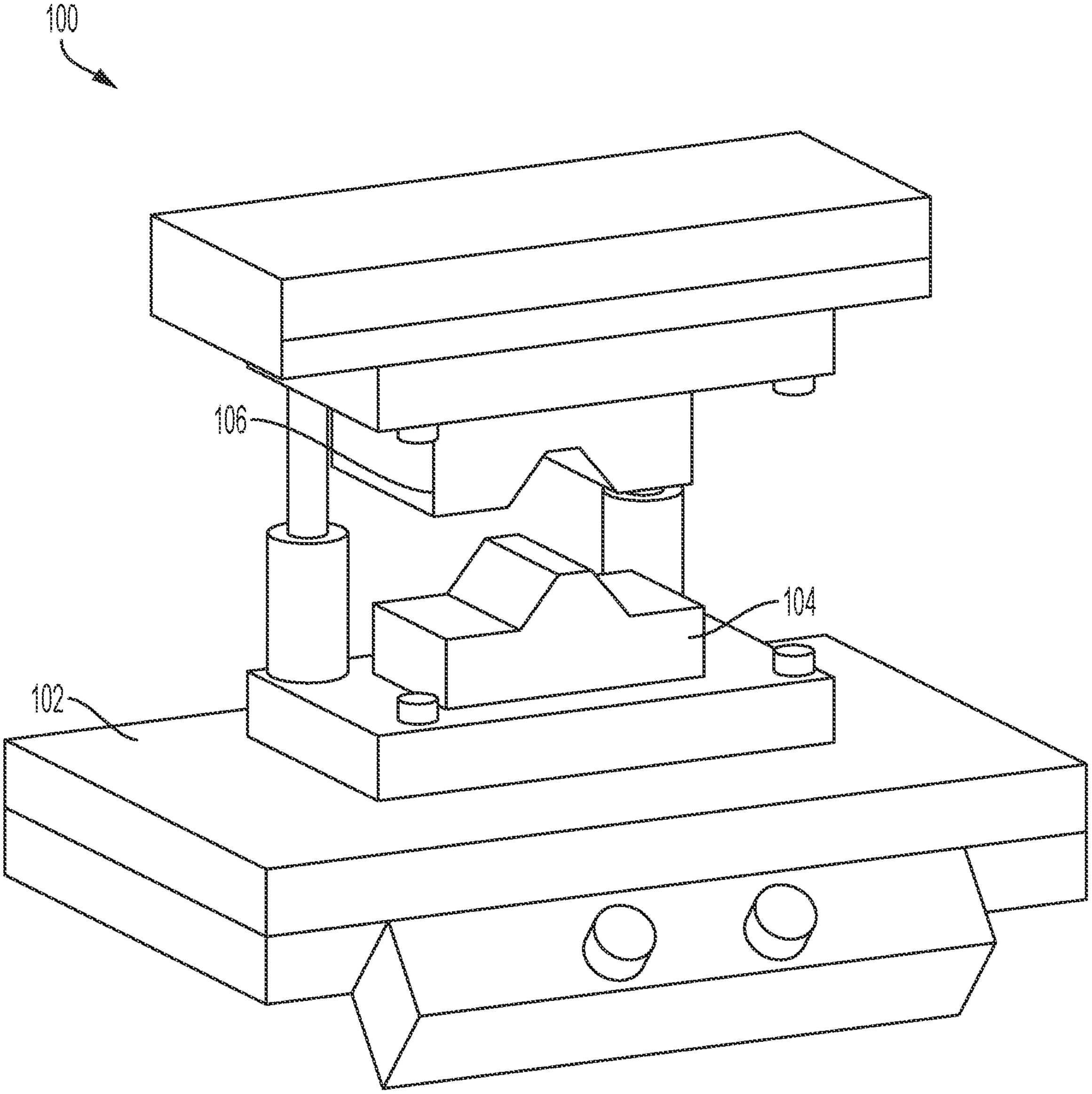
FIG. 3 illustrates an example press machine that may be used for manufacturing a heat spreader, in accordance with embodiments of the present disclosure.

FIG. 3 schematically illustrates a stamping system 100 that may be used for forming a heat spreader, as will be described further with reference to FIGS. 4-9B. Specifically, stamping system 100 includes a plate 102 for securing a die 104 in place. Die 104 and plate 102 are secured such that during the stamping process die 104 and plate 102 remain stationary. Stamping system 100 further includes a punch 106 that is configured for repeated motion up and down in a vertical direction. In operation, a sheet of material, for example a metal, may be placed onto die 104 and punch 106 may be actuated by a ram for downward motion onto the material. During this process, the punch 106 is forced downwardly onto the material within stamping system 100 to press the material to conform to the shape of die 104 and/or punch 106. For example, as illustrated, die 104 has a protrusion that extends upward while punch 106 has a corresponding V-shaped groove. As a result of this, once compressed, the work piece between die 104 and punch 106 will have a projection matching the shape of the projection of die 104 and the groove of punch 106. While illustrated as having a projection, die 104 and/or punch 106 may have varying shapes and configurations. For example, die 104 and/or punch 106 may have a flat profile, domed profile, or otherwise irregularly shaped profile. Stamping system 100 may be used to form heat spreader 120, further described below, using a die 104 and punch 106 to perform one or more steps to cold-form a blank of material into the desired shape and configuration of heat spreader 120.

Figure 1:
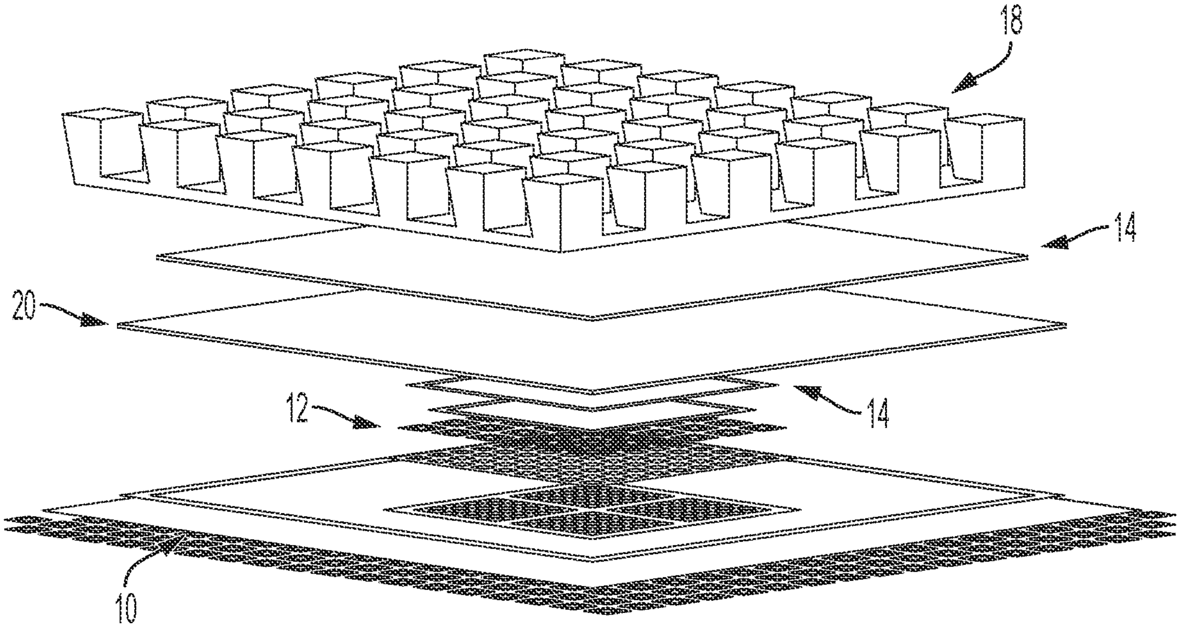
FIG. 1 illustrates a schematic of an example use for a heat spreader.
Figure 2A:
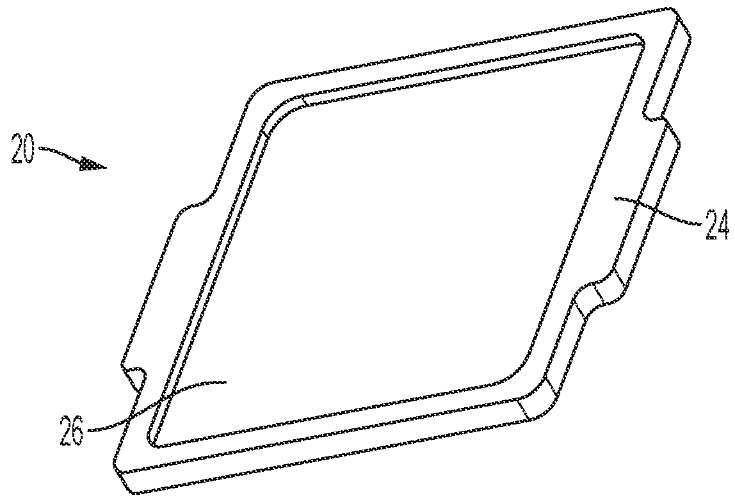
FIG. 2A illustrates a heat spreader as is known generally in the art.
Figure 2B:
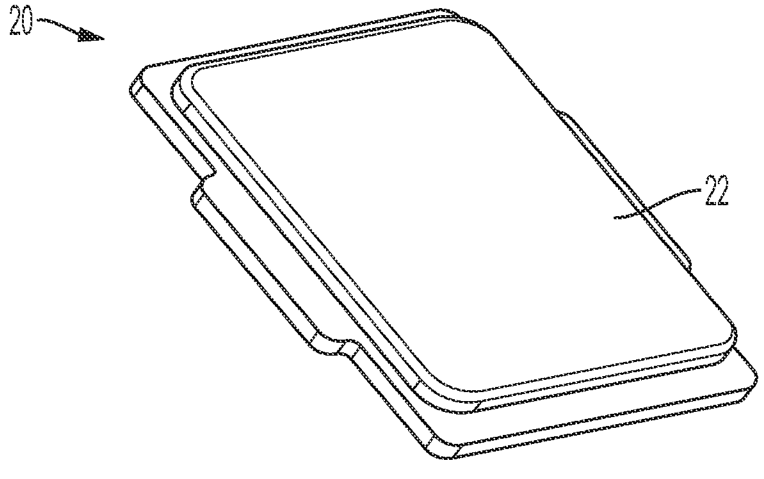
FIG. 2B illustrates a heat spreader as is known generally in the art.

Stamping system 100 may be optimized and used in a process for creating a target shape and/or configuration of heat spreader 20, shown in FIGS. 2A and 2B, or for heat spreader 120 as will be described further herein.

Figure 4:
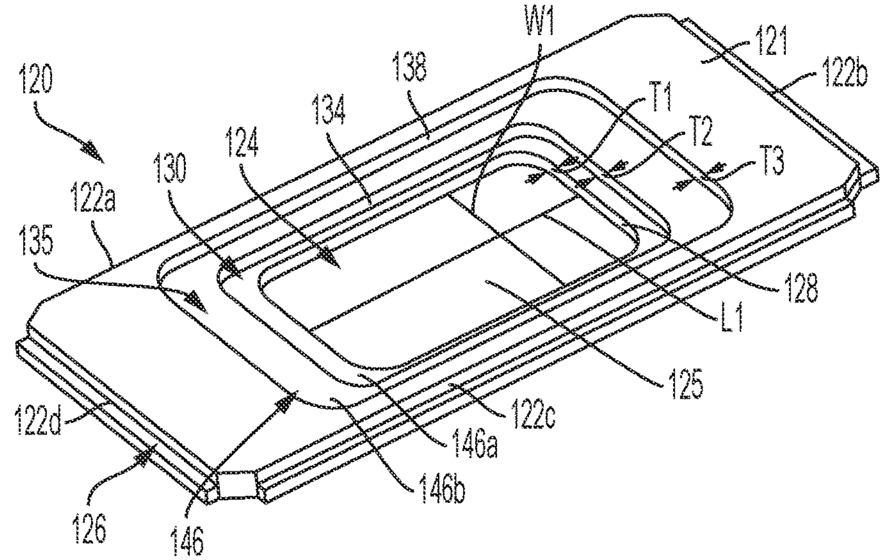
FIG. 4 illustrates a bottom perspective view of an example heat spreader, in accordance with embodiments of the present disclosure.

FIG. 4 illustrates a bottom perspective view of an exemplary heat spreader 120 that may be formed using stamping system 100 (FIG. 3) with alternative configurations for die 104 and punch 106. As illustrated, FIG. 4 includes a bottom surface 121 opposite a top surface 119 (FIG. 5B). Heat spreader 120 is defined by a generally rectangular shape having a plurality of sides 122. Illustratively, plurality of sides 122 includes a first side 122*a*, a second side 122*b*, a third side 122*c*, and a fourth side 122*d*. Arranged along and extending laterally from each side 122 of heat spreader 120 is an outer periphery 126. Additionally, extending upwardly and inwardly into heat spreader 120 from bottom surface 121 is a cavity 124. Cavity 124 includes a bottom surface 125 having a generally rectangular shape with a length L1 and a width W1. Cavity 124 includes a first inner wall 128 extending vertically down from bottom surface 125 of cavity 124. First inner wall 128 is defined by a thickness T1 which is substantially constant (i.e. equal along) around the entirety of first inner wall 128. Extending laterally outward in each direction from the bottom edge of inner wall 128 (i.e., towards each of sides 122 of heat spreader 120) is a first stepped surface 130 extending around the periphery of first inner wall 128 of cavity 124.

Cavity 124 includes a second inner wall 134 extending vertically down from first stepped surface 130. Second inner wall 134 is defined by a thickness T2. Similar to thickness T1, thickness T2 may be substantially constant (i.e. equal) around the entirety of second inner wall 134. Extending laterally from second inner wall 134 is a second stepped surface 135. As illustrated, extending vertically down from second stepped surface 135, heat spreader 120 includes a third inner wall 138. Third inner wall 138 defines a thickness T3 and extends vertically to connect with bottom surface 121 of heat spreader 120. In other words, bottom surface 121 extends laterally outward from the top of third inner wall 138. Similar to thickness T2, thickness T3 may be substantially constant (i.e. equal) around entirety of third inner wall 138.

As such, cavity 124 defines a plurality of steps 146, including a first step 146*a* and a second step 146*b* formed by the various stepped surfaces and inner walls. While illustrated as including two steps between bottom surface 125 of cavity 124 and bottom surface 121 of heat spreader 120, various other embodiments may include any number of steps. For example, the plurality of steps 146 may include three or more steps as required or desired for a particular application. Generally speaking, an increased number of steps 146 may be used to increase the overall depth of the cavity 124 without requiring a greater overall thickness T4 of the lid 123 and heat spreader 120.

Figure 5A:
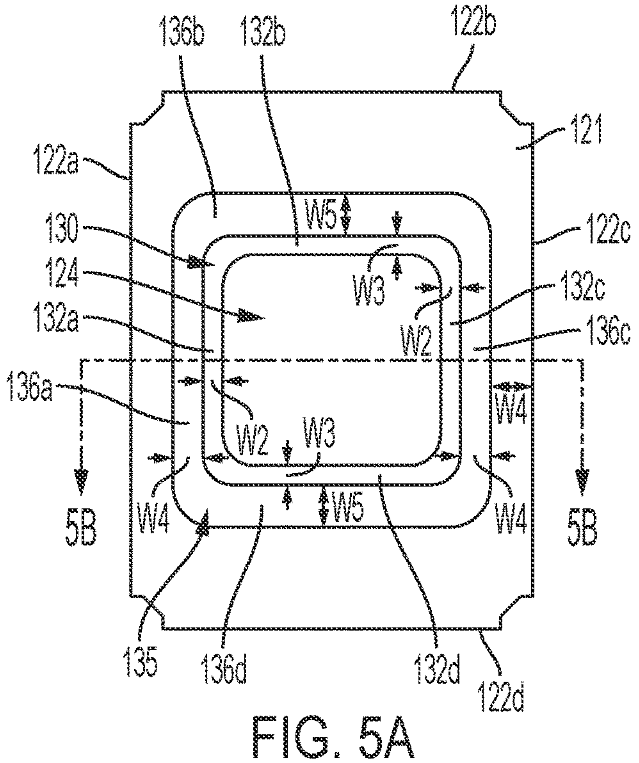
FIG. 5A illustrates a bottom view of the example heat spreader of FIG. 4.
Figure 5B:
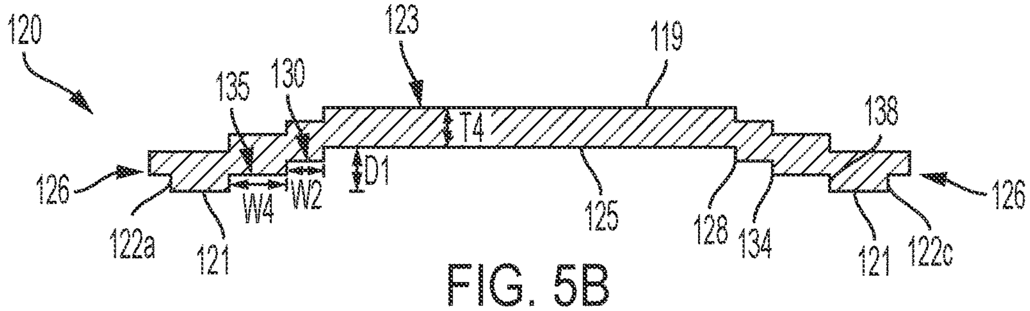
FIG. 5B illustrates a cross sectional view of the example heat spreader of FIG. 5A, taken along the line 5B-5B.

FIG. 5A illustrates a bottom view of heat spreader 120 illustrating the cavity 124 extending into bottom surface 121. As illustrated, first stepped surface 130 includes a first portion 132*a*, a second portion 132*b*, a third portion 132*c*, and a fourth portion 132*d*. First portion 132*a* is defined by a width W2, second portion 132*b* is defined by a width W3, third portion 132*c* is defined by width W2, and fourth portion 132*d* is defined by width W3. As illustrated, width W2 may be approximately equal to width W3. However, in other embodiments, width W2 may be greater than or less than width D3.

Further, second stepped surface 135 includes a first portion 136*a*, a second portion 136*b*, a third portion 136*c*, and a fourth portion 136*d*. First portion 136*a* is defined by a width W4, second portion 136*b* is defined by a width W5, third portion 136*c* is defined by width W4 and fourth portion 136*d* is defined by width W5. As illustrated, width W4 may be less than width W5, however, in various other embodiments width W4 and width W5 may be equal. In further embodiments, width W4 may be greater than width W5. However, various other configurations for the widths of each portion 136 may be incorporated. For example, each portion 136 may have a different width or each portion 136 may have the same width.

FIG. 5B illustrates a cross sectional view of heat spreader 120 taken along line 5B-5B of FIG. 5A. As shown, cavity 124 extends upwardly from bottom surface 121 and includes bottom surface 125, first stepped surface 130 and second stepped surface 135 extending around entirety of cavity 124. Cavity 124 defines an overall depth D1 that extends from bottom surface 125 to bottom surface 121 of heat spreader 120. Further, as illustrated, outer periphery 126 extends laterally outward from each side 122 of heat spreader 120. Specifically, in the cross sectional view of FIG. 5B, outer periphery 126 is illustrated extending from first side 122*a* and third side 112*c*, it being understood that outer periphery 126 extends around all sides 122 of heat spreader 120. Additionally, as illustrated, heat spreader 120 includes a lid 123 defined as the material extending between bottom surface 125 of cavity 124 and top surface 119 of heat spreader 120. As illustrated, lid 123 is defined by a thickness T4. In embodiments, thickness T4 may have a value ranging between approximately 1 mm and 4 mm. Further, depth D1 may have a value of approximately 50% of T4. For example, depth D1 may range between 0.5 mm to 2.0 mm. However, as the number of steps 146 increases, depth D1 may increase accordingly.

The configuration of first and second stepped surfaces 130, 135 of cavity 124 are such that overall depth D1 of cavity 124 may be maximized while achieving desired thickness T4 of lid 123. Specifically, this may be completed through various stamping processes that partially shear the material of heat spreader 120 in repeated steps to create the various steps 146 that allow for depth D1 to be achieved. In one exemplary embodiment, the partial shearing steps may be half-shearing steps, in which the material is displaced by about half of a thickness T4, as will be described further. The method will be described further with reference to FIGS. 6A-9E.

Figure 6A:
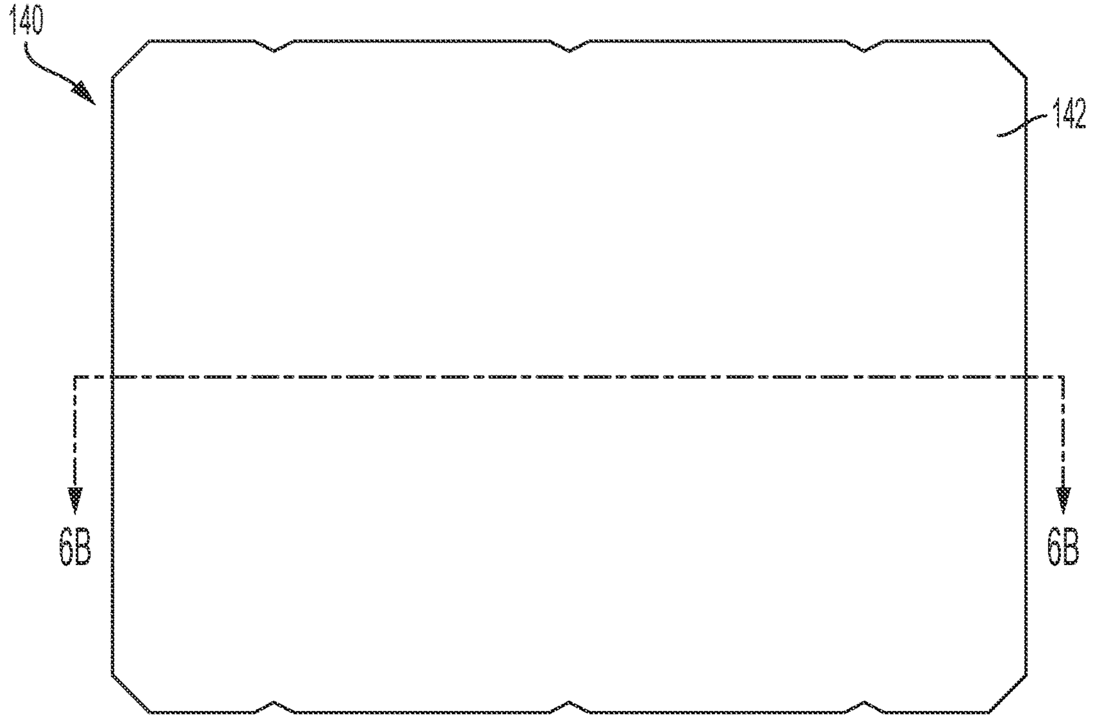
FIG. 6A illustrates a top view of a workpiece, in accordance with embodiments of the present disclosure.
Figure 6B:
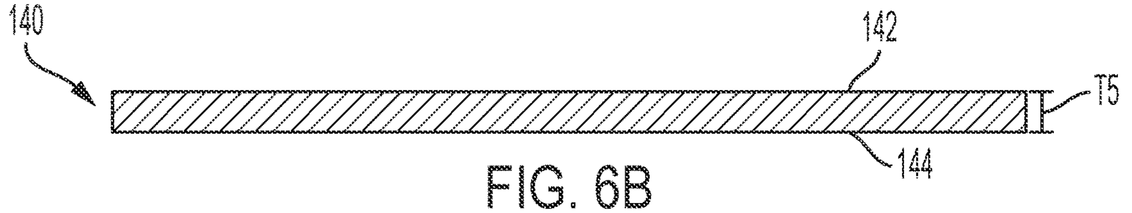
FIG. 6B illustrates a cross sectional view of the workpiece of FIG. 6A, in accordance with embodiments of the present disclosure, taken along the line 6B-6B.

FIG. 6A illustrates a blank sheet 140 which may be formed of a metal, for example, copper. Blank sheet 140 may also be referred to herein as a work piece which may be cut or otherwise produced from a larger piece of sheet stock. FIG. 6B illustrates a cross sectional view of blank sheet 140 illustrating a top surface 142 and a bottom surface 144 of blank sheet 140. Blank sheet 140 defines a thickness T5 extending between bottom surface 144 and top surface 142. Blank sheet 140 is inserted into stamping system 200 of FIG. 6C to undergo processing to reconfigure the blank workpiece 140 into the desired shapes of the finished target configuration of heat spreader 120 shown in FIG. 4.

Figure 6C:
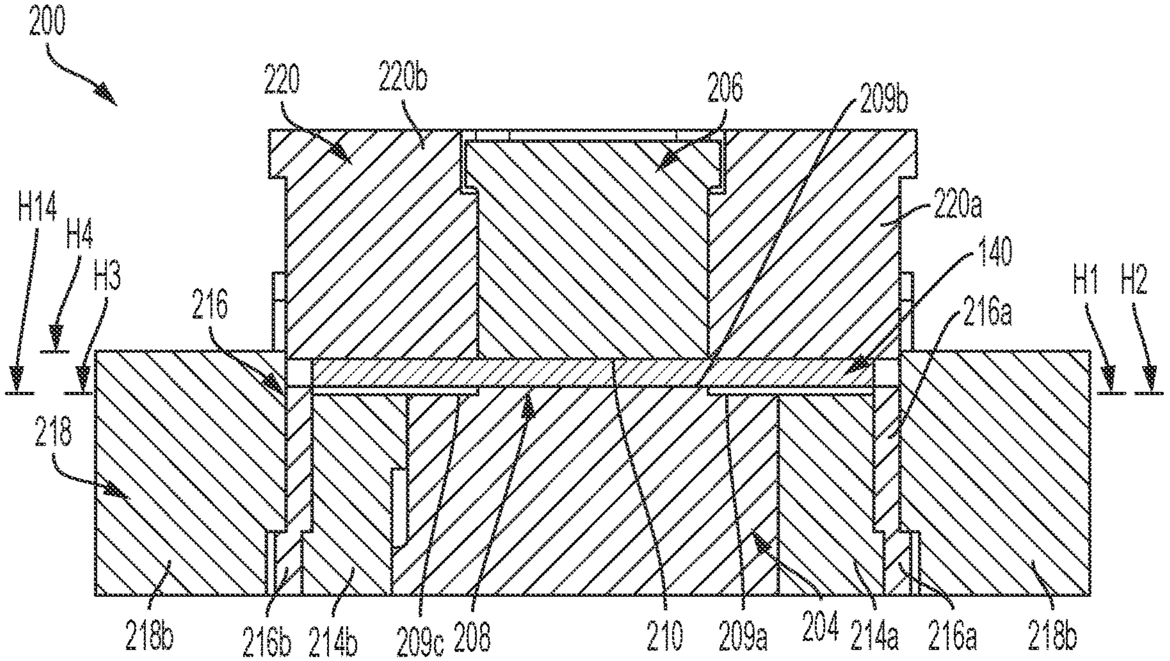
FIG. 6C illustrates a cross sectional view of the workpiece of FIG. 6A within a schematic example press machine in a first configuration before pressing, in accordance with embodiments of the present disclosure.

As illustrated in FIG. 6C, stamping system 200 includes a die 204 and a punch 206, which may be analogous to die 104 and punch 106 described and shown above with respect to FIG. 3. As illustrated, die 204 has a top surface 208 with a first planar portion 209*a*, a second planar portion 209*b* extending from the first planar portion 209*a*, and a third planar portion 209*c* extending from second planar portion 209*b*. Second planar portion 209*b* is positioned vertically upward from first and third planar portions 209*a*, 209*c*, respectively. Further, second planar portion 209*b* may define a height H14 that is greater than a height H2 of first and third planar portions 209*a*, 209*c*. Additionally, as illustrated, punch 206 includes a bottom surface 210 that has a planar and/or flat profile. In embodiments, bottom surface 210 is configured for holding the material of blank sheet 140 in place such that the geometry of top surface 142 of blank sheet 140 remains constant.

Stamping system 200 further includes a plurality of lower die inserts 214, illustratively a first lower die insert 214*a* and a second lower die insert 214*b*. Although two lower die inserts 214 are shown in the cross-section of FIG. 6C, it is understood that four lower die inserts 214 are provided to correspond to each of the four edges around the entire circumference of the workpiece 140. Each lower die insert 214*a*, 214*b* is positioned on a side of die 204. In other words, die 204 is sandwiched between lower die inserts 214*a*, 214*b*. As illustrated, lower die inserts 214 are defined by a height H1 that is approximately equal to a height H2 of first and third planar portions 209*a*, 209*c* of die 204.

Further, stamping system 200 includes a plurality of side inserts 216, illustratively a first side insert 216*a* and a second side insert 216*b*, with additional side inserts 216 not shown but corresponding to the two additional lower die inserts described above. First and second side inserts 216*a*, 216*b* are positioned adjacent first and second lower die inserts 214*a*, 214*b*. In this way, lower die inserts 214 and die 204 are sandwiched between first and second side inserts 216*a*, 216*b*. As illustrated, side inserts 216 define a height H3 that is greater than the height H2 of lower die inserts 214.

With continued reference to the FIG. 6C, stamping system 200 includes a plurality of die plates 218, illustratively a first die plate 218*a* and a second die plate 218*b*, with additional die plates 218 not shown but corresponding to the two additional lower die inserts as described above. Each die plate 218*a*, 218*b* is positioned adjacent side inserts 216*a*, 216*b* such that side inserts 216, lower die inserts 214 and die 204 are sandwiched between die plates 218. As illustrated, die plates 218 define a height H4 that may be greater than height H1 of die 204, height H2 of lower die inserts 214 and height H3 of side inserts 216. Additionally, as illustrated, die plates 218 extend vertically and laterally adjacent entirely of workpiece 140. In this way, stamping system 200 operates as an open tooling system such that material of blank sheet 140 is able to extend outward laterally beyond side inserts.

Additionally, stamping system 200 includes a plurality of upper die inserts 220, illustratively a first upper wall 220*a* and a second upper wall 220*b*, with additional upper die inserts 220 not shown but corresponding to the two additional die inserts as described above. As illustrated, each of die inserts 220 extend laterally outward and beyond work piece 140. Die inserts 220 each include a bottom surface having a flat and/or planar profile that may be contiguous with the flat profile of bottom surface 210 of punch 206.

FIG. 6C illustrates blank sheet 140 positioned within stamping system 200 prior to the compression of punch 206 and die inserts 220 down onto blank sheet 140. Compression of punch 206 and die inserts 220 into blank sheet 140 is defined by vertical movement of die inserts 220 and punch 206 onto blank sheet 140.

Figure 6D:
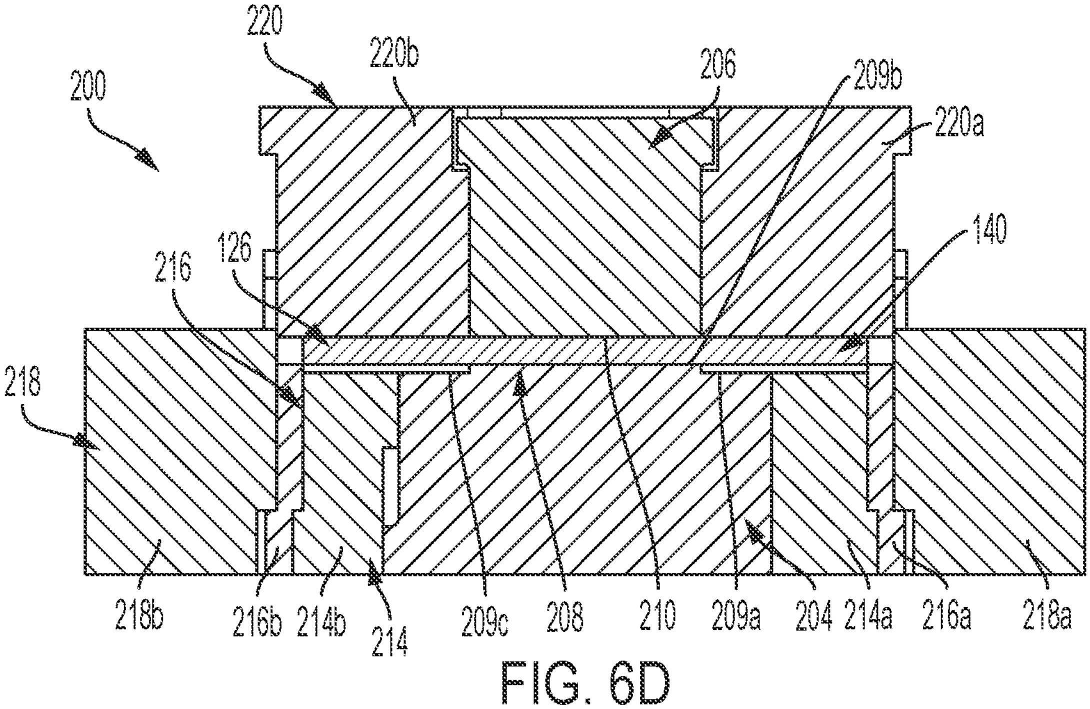
FIG. 6D illustrates a cross sectional view of the workpiece of FIG. 6A within the schematic example press machine of FIG. 6C in the first configuration after pressing, in accordance with embodiments of the present disclosure.
Figure 7A:
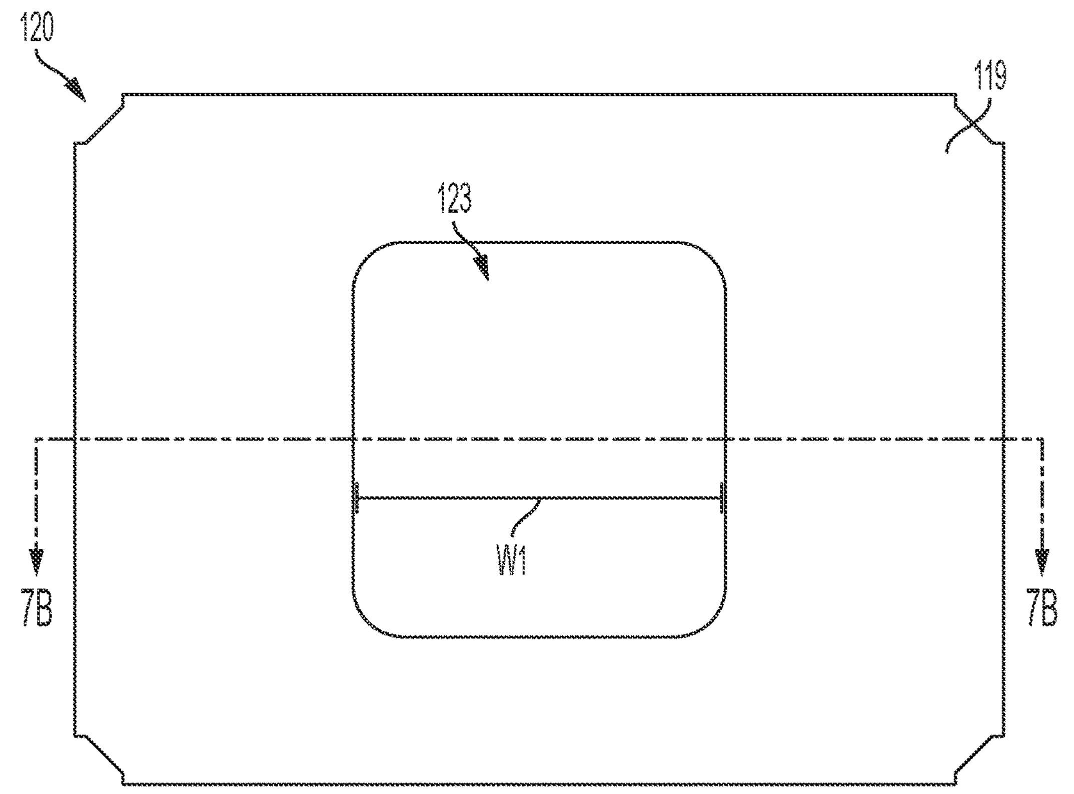
FIG. 7A illustrates a top view of a partially formed heat spreader, in accordance with embodiments of the present disclosure.
Figure 7B:
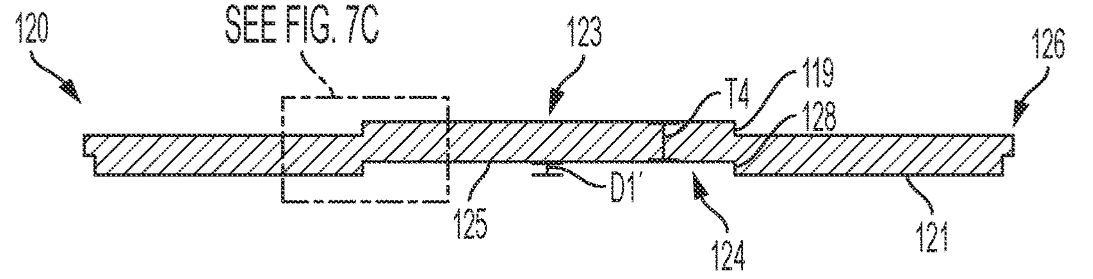
FIG. 7B illustrates a cross sectional view of the partially formed heat spreader of FIG. 7A, taken along the line 7B-7B.
Figure 7C:
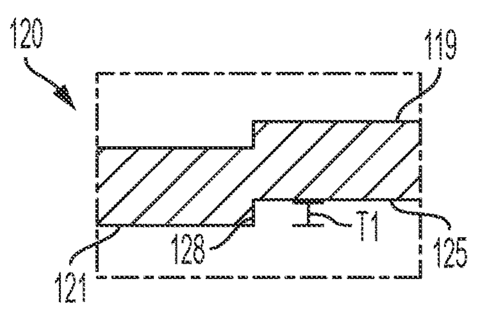
FIG. 7C illustrates an enlarged view of a portion of the cross sectional view of the partially formed heat spreader of FIG. 7B.

After compression of blank sheet 140, an interim phase of heat spreader 120 is formed, as illustrated in FIGS. 7A-7C, such that heat spreader 120 is partially formed. The center portion of punch 206 pushes down onto blank sheet 140 such that blank sheet 140 is squeezed between the center portion punch 206 and die 204, while the die inserts 220 are forced downward relative to the center portion of punch 206, causing the material of blank sheet 140 to flows upward and laterally outward. By this stamping process, material flows outward to form bottom surface 125 of cavity 124 and outer periphery 126. In particular, this stamping process is a "half shear" step which shears the blank 140, dislocating the periphery 126 of the blank 140 from the lid 123 thereof to create the "step" feature shown in FIG. 7B and form cavity 124 and lid 123. In embodiments, the thickness of the shear is approximately 60% or less of thickness T4 (FIG. 5B) upwards. As shown in FIG. 6D, blank 140 is sheared by the step formed by second planar portion 209*b* of die 204, which comes into contact with blank sheet 140 to form first inner wall 128 (FIG. 7B) extending from and around cavity 124. After this step, both cavity 124 and lid 123 are defined by width W1 (FIG. 7A) and cavity 124 includes a first depth D1' (FIG. 7B) extending between bottom surface 125 of cavity 124 bottom surface 121 of partially formed heat spreader 120. First depth D1' may have a value of approximately 60% of thickness T4, described above. The corresponding height or thickness T1 of inner wall 128 (FIG. 7C) is equal to D1'. Referring to FIG. 6D, the first stamping process causes material to flows laterally into at least a portion of the spacing vertically between side inserts 216 and die inserts 220 of stamping system 200 to form outer periphery 126 (FIG. 7B).

In order to advance towards target configuration of heat spreader 120 as shown in FIGS. 4-5B, partially formed heat spreader 120 of FIGS. 7A-7C is inserted into a stamping system 300 for a second stamping process, as will be described with reference to FIGS. 8A-8E.

Figure 8A:
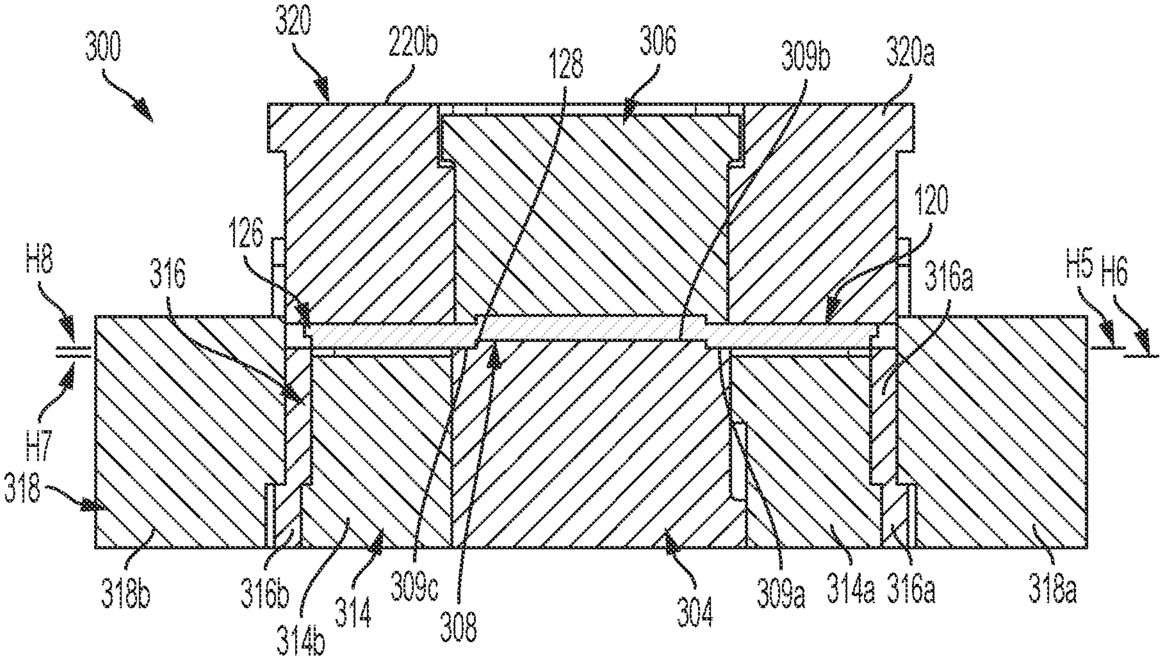
FIG. 8A illustrates a cross sectional view of the partially formed heat spreader of FIG. 7A within a schematic example press machine in a second configuration before pressing, in accordance with embodiments of the present disclosure.
Figure 8B:
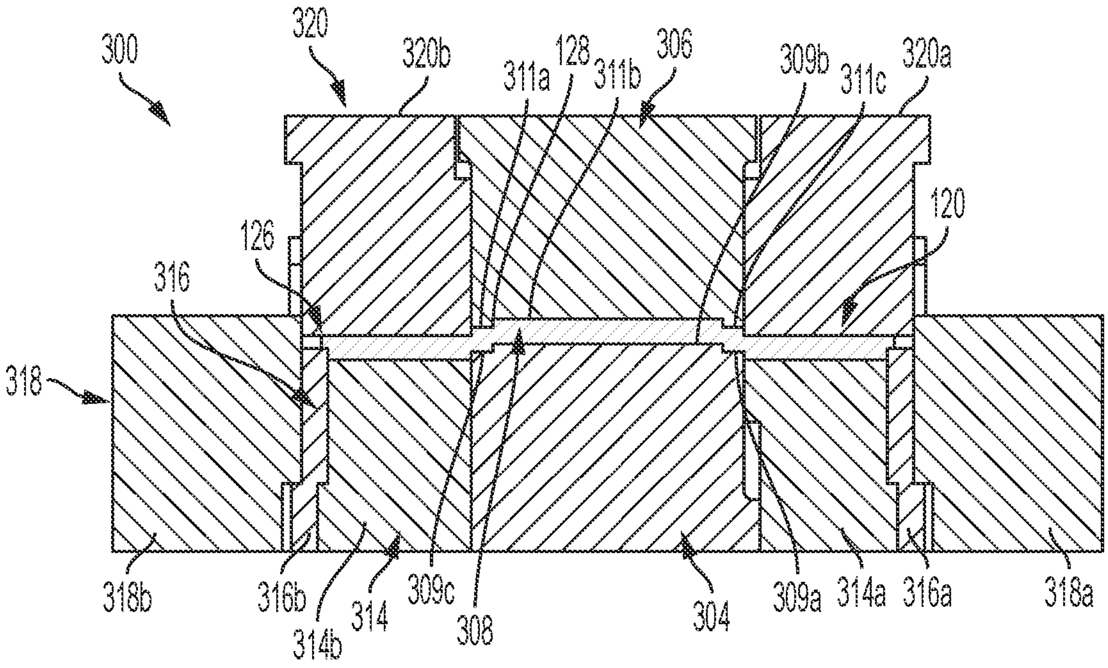
FIG. 8B illustrates a cross sectional view of the partially formed heat spreader of FIG. 7A within the schematic example press machine of FIG. 8A in the second configuration after pressing.

FIGS. 8A-8B illustrate a cross sectional view of stamping system 300, which may be similar to stamping system 200 of FIGS. 6C-6D, with some variations as will be described herein. Stamping system 300 includes a die 304 and a punch 306, which may be analogous to die 204 and punch 206. Die 304 includes a top surface 308 having a first planar portion 309*a* adjacent a second planar portion 309*b*. Second planar portion 309*b* is positioned adjacent third planar portion 309*c*. Further, second planar portion 309*b* may define a height H5 that is greater than a height H6 of first and third planar portions 309*a*, 309*c*. Punch 306 includes a punch surface having a first planar portion 311*a*, a second planar portion 311*b* and a third planar portion 311*c*. Second planar portion 311*b* extends between first and third planar portions 311*a*, 311*c* and is positioned vertically above first and third planar portions 311*a*, 311*c*.

Additionally, stamping system 300 includes a plurality of lower die inserts 314, including the illustrated first lower die insert 314*a* and second lower die insert 314*b*, it being understood that additional die inserts 314 are provided around the entire periphery of the die 304. Each lower die insert 314 is positioned on a side of die 304 such that die 304 is sandwiched between lower die inserts 314. Further, lower die inserts 314 are defined by a height H7 that is less than height H6 of first and third planar portions 309*a*, 309*c*. Stamping system 300 also includes a plurality of side inserts 316, illustratively a first side insert 316*a* and a second side insert 316*b*, it being understood that additional side inserts 316 are provided around the entire periphery of the die 304. As illustrated, side inserts 316 extend vertically upward to a height H8 that is greater than a height H7 of lower die inserts 314. Specifically, side inserts 316 extend vertically upward to a height H8 that is approximately equal to a height H6 of first and third planar portions 309*a*, 309*c* of die 304. Stamping system 300 may additionally include upper die inserts 320 positioned adjacent punch 306, illustratively first and second upper die inserts 320*a*, 320*b* it being understood that additional upper die inserts 320 are provided around the entire periphery of the punch 306 such that punch 306 is sandwiched between upper die inserts 320.

As illustrated in the configuration of FIG. 8A, punch 306 and die 304 are both in contact with the portions of heat spreader 120 positioned directly below and directly above punch 306 and die 304. More specifically, second planar portion 311*b* of punch 206 and second planar portion 309*b* of die 304 each have a width that extends across the entire width W1 (FIG. 4) of cavity 124. A similar correspondence exists for the length dimension, such that the area of the second planar portion 311*b* of punch 206 corresponds to the area of the top surface of the lid 123, and third planar portion 309*b* of die 304 corresponds to the area of the area of the bottom surface 125 of cavity 124. This correspondence ensures that the material of lid 123 and bottom surface 125 of cavity 124 are held in place such that the geometry is preserved and maintained during the second step of the stamping process. However, as best seen in FIG. 8A, there is a spacing between lower die inserts 314 and the portions of heat spreader 120 directly vertically above lower die inserts 314. As will be discussed further with reference to FIG. 8B, this spacing allows for an additional half shear of the material of partially formed heat spreader 120.

FIG. 8B illustrates stamping system 300 after actuation thereof, which effects a second step of stamping process to further reconfigure the partially formed heat spreader 120. Upper die inserts 320 are actuated downwards while the center portion of punch 306 is held in place, such that a second half shear is effected radially outward of the first half shear described above. Partially formed heat spreader 120 is therefore advanced downwardly into contact with the plurality of lower die inserts 314. As illustrated, this configuration of stamping system 300 and actuation of upper die inserts 320 and punch 306 downwards creates a second step feature in the partially formed heat spreader 120, including second inner wall 134 of cavity 124 shown in FIG. 8E. Thickness T2 of second inner wall 134 is achieved by this additional half shear of the material of less than 60% of thickness T10, as illustrated in FIG. 8E. Additionally, the second stamping process shifts outer periphery 126 downwards to be engaged with side inserts 316. The resulting partially formed heat spreader 120 is illustrated in FIGS. 8C-8E.

Figure 8C:
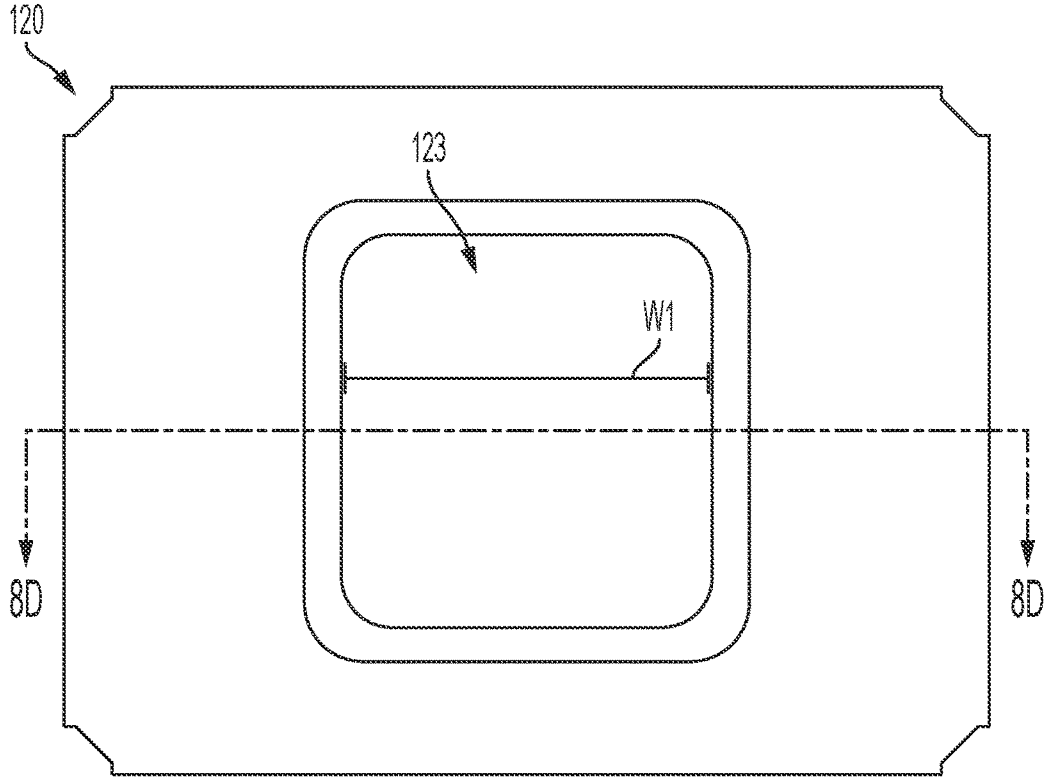
FIG. 8C illustrates a top view of a partially formed heat spreader, in accordance with embodiments of the present disclosure.

FIG. 8C illustrates a top view of partially formed heat spreader 120 with lid 123 extending from top surface 119. FIG. 8D illustrates a cross sectional view of heat spreader 120 taken along line 8D-8D in FIG. 8D. As illustrated, cavity 124 includes bottom surface 125, first inner wall 128 extending downward from bottom surface 125 of cavity 124, and extending into first step stepped surface 130 of cavity 124. Extending vertically downward from first stepped surface 130 is second inner wall 134 which then extends into second stepped surface 135. In this way, second stepped surface 135 is vertically offset from bottom surface 125 of cavity 124 by thickness T1 of first inner wall 128. Further, in this embodiment, cavity 124 is defined by a depth D1" which extends from bottom surface 125 of cavity 124 and bottom surface 121 of heat spreader 120. Due to the additional half shear of the material of heat spreader 120, depth D1" shown in FIG. 8D is greater than depth D1' of cavity 124 shown in FIG. 7B.

Figure 8D:
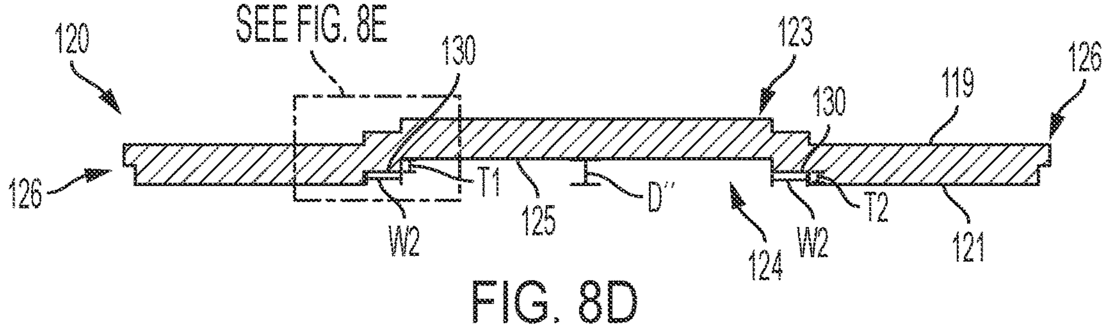
FIG. 8D illustrates a cross sectional view of the partially formed heat spreader of FIG. 8C, taken along the line 8D-8D.
Figure 8E:
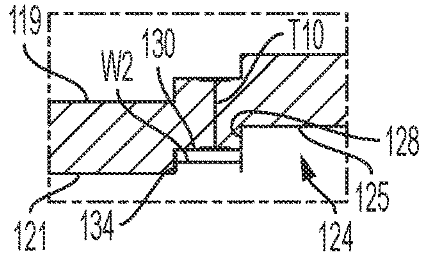
FIG. 8E illustrates an enlarged view of a portion of the cross sectional view of the partially formed heat spreader of FIG. 8D.

In order to continue processing partially formed heat spreader 120 of FIG. 8C to reach the illustrative configuration of heat spreader 120 shown in FIGS. 4-5B, partially formed heat spreader 120 of FIGS. 8C-8E is inserted into an additional stamping system to undergo a further stamping process, as will be discussed further with reference to FIGS. 9A-9B.

Figure 9A:
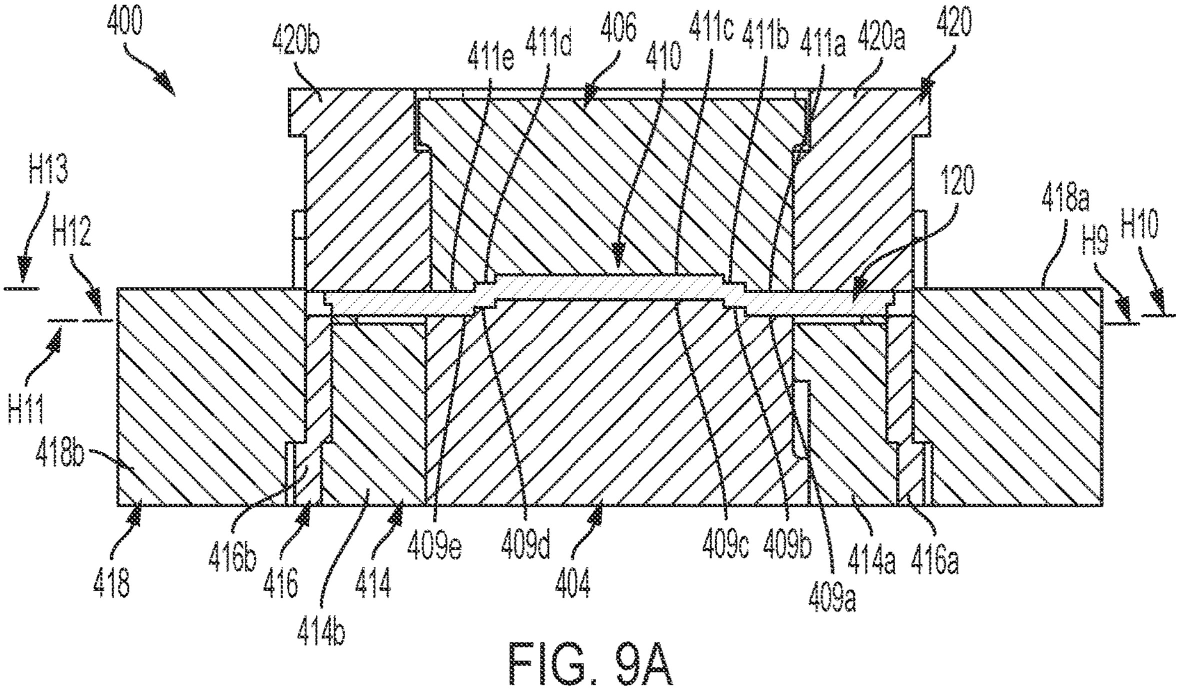
FIG. 9A illustrates a cross sectional view of the partially formed heat spreader of FIG. 8C within a schematic example press machine in a third configuration before pressing, in accordance with embodiments of the present disclosure.
Figure 9B:
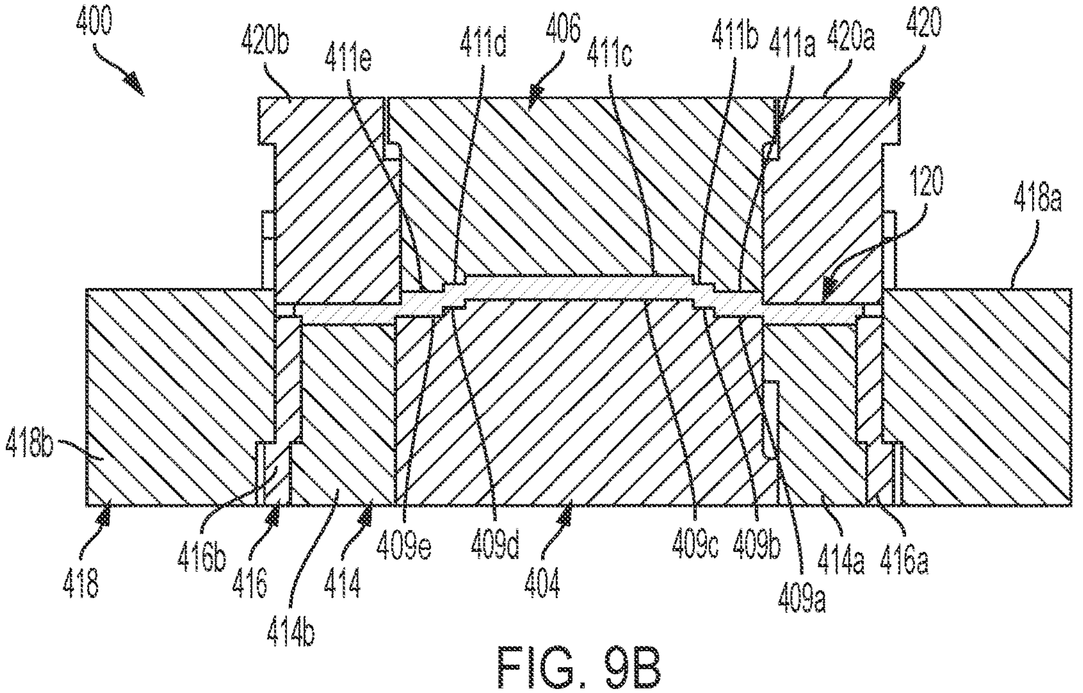
FIG. 9B illustrates a cross sectional view of the partially formed heat spreader of FIG. 8C within the schematic example press machine of FIG. 9A in the third configuration after pressing.

FIGS. 9A-9B illustrate a stamping system 400, which may be a variation of stamping system 100 of FIG. 3. As illustrated, stamping system 400 includes a die 404 and a punch 406, which may be analogous to die 104 and punch 106 described and shown above with respect to FIG. 3. As illustrated, die 404 has a top die surface with a first planar portion 409*a*, a second planar portion 409*b* positioned above the first planar portion 409*a*, and a third planar portion 409*c* positioned above the second planar portion 409*b*. Second planar portion 409*b* combines with a fourth portion 409*d* and additional planar portions not shown to create an upper annular punch surface surrounding the central planar portion 409*c* and corresponding to first stepped surface 130, as further described below. First planar portion 409*a* similarly combines with a fifth planar portion 409*e* and additional planar portions not shown to create a lower annular punch surface surrounding the upper annular punch surface and corresponding to second stepped surface 135, as also described below. In this way, the die surface of die 404 is configured to engage with bottom surface 125 of cavity 124, first stepped surface 130, and second stepped surface 135, and at least a portion of bottom surface 121 of heat spreader 120.

Similarly, punch 406 includes a punch surface having a profile configured for engagement with top surface 119 of heat spreader 120. As shown in FIG. 9A, the punch surface of punch 406 includes a first planar portion 411*a*, a second planar portion 411*b*, and a third planar portion 411*c*. The second planar portion 411*b* combines with a fourth planar portion 411*d* and additional planar portions not shown to create an upper annular punch surface surrounding the central planar portion 411*c* and corresponding to the upper portion of lid 123 above first stepped surface 130. The first planar portion 411*a* combines with a fifth planar portion 411*e* and additional planar portions not shown to create a lower annular punch surface surrounding the central upper stepped surface and corresponding to the upper portion of lid 123 above what will become second stepped surface 130 after the second stamping process described below. The various planar portions 411 are vertically offset from one another to seat with and firmly engage the profile of top surface 119 of heat spreader 120. As such, in the configuration of FIG. 9A which illustrates heat spreader 120 before compression of heat spreader 120 within stamping system 400, the punch surface of punch 406 and the opposing die surface of die 404 are in contact with the portion of heat spreader 120 directly below and directly above punch 406 and die 404, respectively.

With reference still to FIG. 9A, stamping system 400 includes a plurality of lower die inserts 414, illustratively a first lower die insert 414*a* and a second lower die insert 414*b*. Although two lower die inserts 414 are shown in the cross-section of FIG. 9A, it is understood that four lower die inserts 414 are provided to correspond to each of the four edges around the entire circumference of the workpiece 140. Each lower die insert 414*a*, 414*b* is positioned on a side of die 404. In other words, die 404 is sandwiched between lower die inserts 414*a*, 414*b*. As illustrated, lower die inserts 414 extend to a height H9 that is less than a height H11 of first and fifth planar portions 409*a*, 409*e* of die 404. Further, stamping system 400 further includes a plurality of side inserts 416, illustratively a first side insert 416*a*, a second side insert 416*b*, with additional side inserts 416 not shown but corresponding to the two additional lower die inserts described above. First and second side inserts 416*a*, 416*b* are positioned adjacent first and second lower die inserts 414*a*, 414*b*, it being understood that additional die inserts now shown are provided to completely surround the die inserts 414. In this way, lower die inserts 414 and die 404 are sandwiched between the inserts 416. As illustrated, side inserts 416 extend to a height H12 that is greater than height H9 of lower die inserts 414 and approximately equal to height H11 of first and fifth planar portions 409*a*, 409*e*.

With continued reference to the FIGS. 9A-9B, stamping system 400 includes a plurality of die plates 418, illustratively a first die plate 418*a* and a second die plate 418*b*, with additional die plates 418 not shown but corresponding to the two additional lower die inserts as described above. Each die plate 418*a*, 418*b* is positioned adjacent side inserts 416*a*, 416*b* such that side inserts 416, lower die inserts 414 and die 404 are sandwiched between die plates 418. As illustrated, die plates 418 extend to a height H13 that may be greater than height H11 of first and fifth planar portions 409*a*, 409*e*, height H9 of lower die inserts 414 and height H12 of side inserts 416. Additionally, as illustrated, die plates 418 extend vertically upward and laterally adjacent workpiece 140. In this way, stamping system 400 operates as an open tooling system such that material of blank sheet 140 and the partially formed heat spreader 120 may extend laterally outward to form outer periphery 126.

Additionally, stamping system 400 includes a plurality of upper die inserts 420, illustratively a first upper die insert 420*a* and a second upper die insert 420*b* with additional upper die inserts 420 not shown but corresponding to the two additional die plates as described above. As illustrated, each of upper die inserts 420 extend laterally outward beyond work piece 140 and include a flat/planar profile that may be continuous with the flat/planar profile of bottom surface 410 of punch 406. The varying heights of the components of stamping system 400 allows for the retention of first inner wall 128, first stepped surface 130, and second inner wall 134 during the final step of the stamping process.

In the configuration FIG. 9A, heat spreader 120 has not yet been compressed within stamping system 400. Illustratively, the die surface of die 404 and opposing punch surface of punch 406 are positioned in direct contact with heat spreader 120. However, the portions of heat spreader 120 directly above plurality of lower die inserts 414 are spaced apart from lower die inserts 414, and outer periphery 126 is illustrated spaced apart from side inserts 416, as shown.

FIG. 9B illustrates heat spreader 120 positioned within stamping system 400 after actuation of stamping system 400. More specifically, upper die inserts 420 are actuated downward to compress down onto the portions of heat spreader 120 that are directly below upper die inserts 420 and directly above lower die inserts 414. In this way, the portions of heat spreader 120 are compressed onto lower die inserts 414 and heat spreader 120 undergoes an additional half shear at side walls of die 404. As illustrated, this step of the stamping process creates third inner wall 138 of heat spreader 120 (FIG. 9E) such that cavity 124 includes first stepped surface 130 and second stepped surface 135.

Figure 9C:
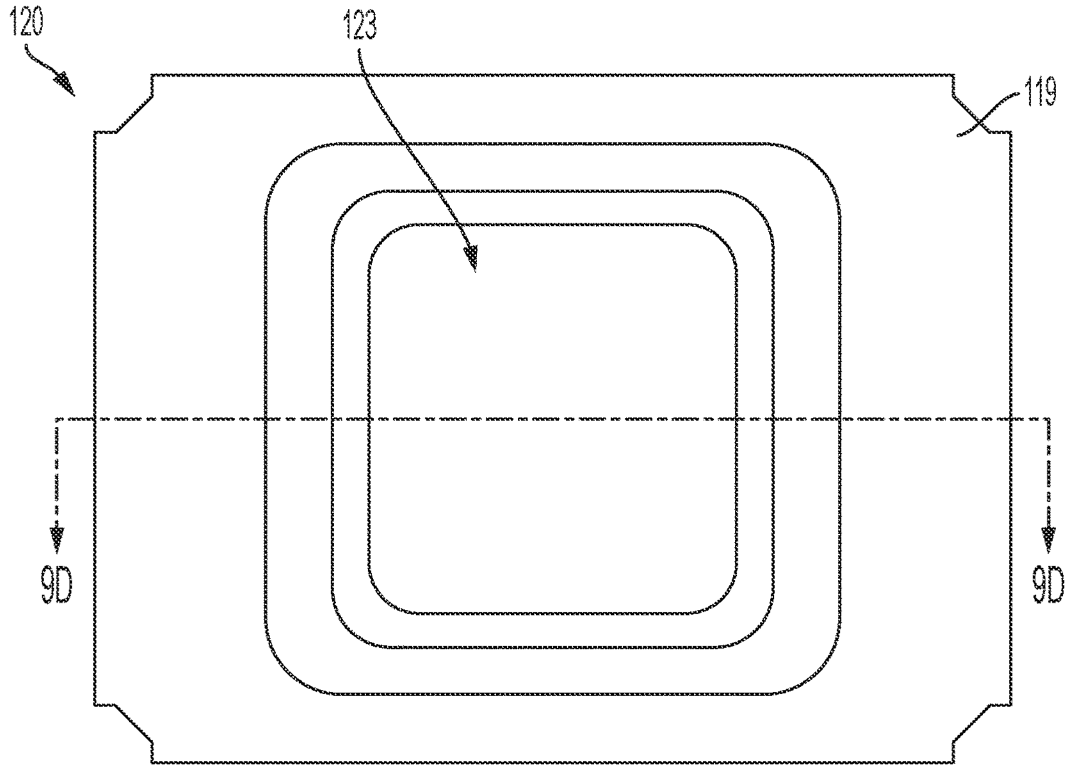
FIG. 9C illustrates a top view of a heat spreader, in accordance with embodiments of the present disclosure.
Figure 9D:
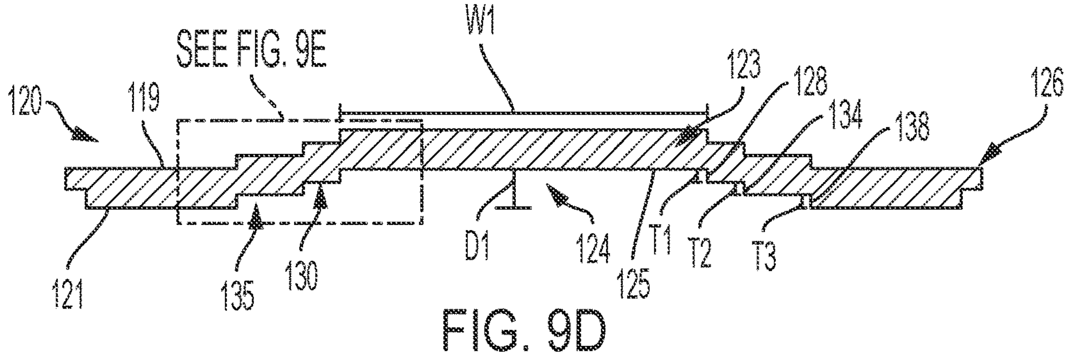
FIG. 9D illustrates a cross sectional view of the heat spreader of FIG. 9C, taken along the line 9D-9D.
Figure 9E:
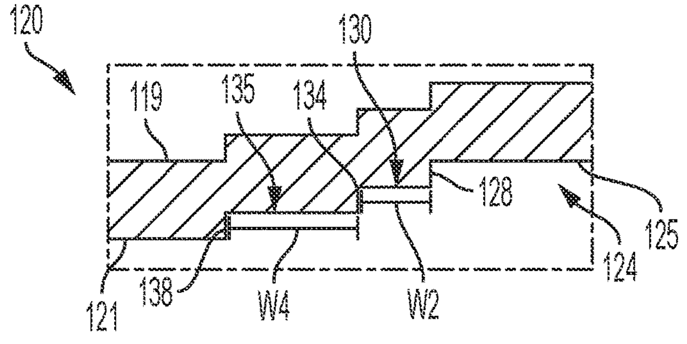
FIG. 9E illustrates an enlarged view of a portion of the cross sectional view of the heat spreader of FIG. 9D.

The resulting heat spreader 120 is shown in FIGS. 9C-9E, which is illustratively the same heat spreader 120 as illustrated in FIGS. 4-5B. As illustrated, the heat spreader 120 includes cavity 124 extending inwardly from bottom surface 121, having depth D1 and first stepped surface 130 and second stepped surface 135 extending around cavity 124. The above described process of half shearing heat spreader 120 allows for depth D1 to be maximized while still maintaining a desired thickness T4 of lid 123. In other words, if cavity 124 was stamped in one step while attempting to achieve depth D1, thickness T4 of lid would likely need to be increased in order to accommodate the material transfer without creating cracks in heat spreader 120. As such, the repetitive half shearing steps allow for lid 123 to maintain a thickness substantially equal to thickness T4 shown after completion of the first step of the stamping process in FIGS. 7A-7C. As noted above, the number of half-shear stamping steps may be decreased or increased according to the overall geometry of the heat spreader and the desired depth of the cavity.

While the above described method and stamping systems 200, 300, and 400 are used for creating heat spreader 120, the above described methods and stamping systems may be modified to achieve variations in target heat spreader 120. For example, the methods and stamping systems may be modified to create heat spreader 120 having three or more steps extending around cavity 124.

ASPECTS

Aspect 1 is a heat spreader including a top surface opposite a bottom surface, a cavity extending from the bottom surface, the cavity defined by a profile having at least two steps such that the cavity includes a first surface spaced from the bottom surface of the cavity by a first distance, a second surface spaced from the bottom surface of the cavity by a second distance, and the first distance being less than the second distance. The heat spreader further includes a lid defined by a thickness extending between the bottom surface of the cavity and the top surface of the heat spreader.

Aspect 2 is the heat spreader of Aspect 1, wherein the first surface is defined by a width and the second surface is defined by a width, wherein the width of the second surface is greater than the width of the first surface.

Aspect 3 is the heat spreader of Aspect 1 or Aspect 2, wherein the cavity has a depth extending from the bottom surface of the cavity to the bottom surface of the heat spreader.

Aspect 4 is the heat spreader of Aspect 3, wherein the depth of the cavity has a value ranging between approximately 0.5 mm to approximately 2.0 mm.

Aspect 5 is the heat spreader of any of Aspects 1-4, wherein the thickness of the lid has a value ranging between approximately 1.0 mm to approximately 4.0 mm.

Aspect 6 is the heat spreader of any of Aspects 1-5, wherein the heat spreader is formed of copper.

Aspect 7 is the heat spreader of any of Aspects 1-6, wherein the heat spreader is defined by a first side, a second side, a third side, and a fourth side.

Aspect 8 is the heat spreader of Aspect 7, wherein the heat spreader includes an outer periphery extending laterally outward from each side of the heat spreader.

Aspect 9 is the heat spreader of any of Aspects 1-8, wherein the lid includes a width approximately equal to a width of the cavity.

Aspect 10 is a heat spreader including a top surface opposite a bottom surface and a plurality of sides defining a generally rectangular shape of the heat spreader, a cavity extending from the bottom surface, the cavity defined by a profile having at least two steps such that the cavity includes a first surface spaced from the bottom surface of the cavity by a first distance, a second surface spaced from the bottom surface of the cavity by a second distance, the first distance being less than the second distance and an outer periphery extending along the plurality of sides of the heat spreader. The heat spreader further includes wherein the three steps of the cavity includes a first step extending downwardly from a bottom surface of the cavity, a second step extending downward from and laterally outward from the first step, and a third step extending downward from and laterally outward from the second step and vertically above the outer periphery.

Aspect 11 is the heat spreader of Aspect 10, wherein the outer periphery extends laterally outward from each of the plurality of sides of the heat spreader.

Aspect 12 is the heat spreader of Aspect 10 or Aspect 11, wherein the cavity has a depth extending from the bottom surface of the cavity to the bottom surface of the heat spreader.

Aspect 13 is the heat spreader of Aspect 12, wherein the depth of the cavity has a value ranging between approximately 0.5 mm to approximately 2.0 mm.

Aspect 14 is the heat spreader of any of Aspects 10-13, wherein the heat spreader includes a lid defined by a thickness extending between the bottom surface of the cavity and the top surface of the heat spreader.

Aspect 15 is the heat spreader of Aspect 14, wherein the thickness of the lid has a value ranging between approximately 1.0 mm to approximately 2.0 mm.

Aspect 16 is a method of forming a heat spreader including stamping a bottom surface of a sheet of the material with a die and a press of a stamping system to half shear the material forming a cavity, such that the cavity has a bottom surface and a top surface, holding the material of the bottom surface and the top surface of the cavity, during the step of holding the material of the bottom surface and the top surface of the cavity, stamping at least a portion of the sheet of material to form a first step extending around the cavity, and holding the material of the cavity and of the first step constant. The method further includes during the step of holding the material of the cavity and of the first step constant, stamping the at least a portion of the sheet of material to form a second step extending around the cavity and the first step.

Aspect 17 is the method of Aspect 16, wherein the cavity has a depth extending from the bottom surface of the cavity and a top surface of the heat spreader.

Aspect 18 is the method of Aspect 17, wherein the depth of the cavity ranges between approximately 0.5 mm to approximately 2.0 mm.

Aspect 19 is the method of Aspect 16 or Aspect 17, wherein stamping the central surface of the sheet of material forms a lid defined by a thickness extending between the bottom surface of the cavity and a top surface of the sheet of material.

Aspect 20 is the method of Aspect 18, wherein the thickness of the lid ranges between approximately 1.0 mm to approximately 4.0 mm.

While this invention has been described as having exemplary designs, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

The invention claimed is:

1. A heat spreader, comprising:

a top surface opposite a bottom surface; and a cavity extending from the bottom surface, the cavity defined by a profile having at least two steps such that the cavity includes a first lower stepped surface spaced from a bottom surface of the cavity by a first distance, a second lower stepped surface spaced from the bottom surface of the heat spreader and spaced from the bottom surface of the cavity by a second distance, the first distance being less than the second distance;

a lid defined by a thickness extending between the bottom surface of the cavity and the top surface of the heat spreader; wherein the thickness is constant along the lid;

a first upper stepped surface arranged horizontally and spaced from the top surface by a third distance; and a second upper stepped surface arranged horizontally and spaced from the top surface by a fourth distance, the fourth distance being greater than the third distance;

wherein the heat spreader includes a sequential horizontal progression from the bottom surface of the cavity to the first lower stepped surface, the second lower stepped surface, and the bottom surface of the heat spreader.

2. The heat spreader of claim 1, wherein the first lower stepped surface is defined by a width and the second lower stepped surface is defined by a width, wherein the width of the second lower stepped surface is greater than the width of the first lower stepped surface.

3. The heat spreader of claim 1, wherein the cavity has a depth extending from the bottom surface of the cavity to the bottom surface of the heat spreader.

4. The heat spreader of claim 3, wherein the depth of the cavity has a value ranging between 0.5 mm to 2.0 mm.

5. The heat spreader of claim 1, wherein the thickness of the lid has a value ranging between 1.0 mm to 4.0 mm.

6. The heat spreader of claim 1, wherein the heat spreader is defined by a first side, a second side, a third side, and a fourth side.

7. The heat spreader of claim 6, wherein the heat spreader includes an outer periphery extending laterally outward from each side of the heat spreader.

8. The heat spreader of claim 1, wherein the thickness is equal to a depth of the cavity.

9. The heat spreader of claim 3, wherein the depth of the cavity is greatest at the lid.

10. The heat spreader of claim 1, wherein a top side comprising the top surface, the first upper stepped surface, and the second upper stepped surface has a convex shape, and a bottom side comprising the cavity and the bottom surface has a concave shape.

11. The heat spreader of claim 1, wherein the heat spreader is constructed of a material comprising copper.

12. The heat spreader of claim 1, wherein the heat spreader is constructed of a material consisting essentially of copper.

* * * * *